United States Patent
Ramkumar

(10) Patent No.: US 10,153,294 B2
(45) Date of Patent: Dec. 11, 2018

(54) METHOD OF ONO STACK FORMATION

(71) Applicant: Cypress Semiconductor Corporation, San Jose, CA (US)

(72) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/721,132

(22) Filed: Sep. 29, 2017

(65) Prior Publication Data

US 2018/0083024 A1 Mar. 22, 2018

Related U.S. Application Data

(63) Continuation of application No. 14/942,773, filed on Nov. 16, 2015, now Pat. No. 9,793,284, which is a
(Continued)

(51) Int. Cl.
| | |
|---|---|
| H01L 21/8234 | (2006.01) |
| H01L 27/11568 | (2017.01) |
| H01L 21/28 | (2006.01) |
| H01L 27/11573 | (2017.01) |
| H01L 29/423 | (2006.01) |
| H01L 29/66 | (2006.01) |

(Continued)

(52) U.S. Cl.
CPC .. *H01L 27/11568* (2013.01); *H01L 21/02255* (2013.01); *H01L 21/02301* (2013.01); *H01L 21/28282* (2013.01); *H01L 21/823462* (2013.01); *H01L 27/11563* (2013.01); *H01L 27/11573* (2013.01); *H01L 29/167* (2013.01); *H01L 29/4234* (2013.01); *H01L 29/513* (2013.01); *H01L 29/518* (2013.01); *H01L 29/66833* (2013.01); *H01L 29/792* (2013.01)

(58) Field of Classification Search
CPC ......... H01L 21/02225; H01L 21/02227; H01L 21/02296; H01L 21/8232; H01L 21/8239
See application file for complete search history.

(56) References Cited

U.S. PATENT DOCUMENTS

| | | | |
|---|---|---|---|
| 6,265,268 B1 | 7/2001 | Halliyal et al. | |
| 6,297,096 B1 | 10/2001 | Boaz | |

(Continued)

FOREIGN PATENT DOCUMENTS

CN 103258798 B 5/2015

OTHER PUBLICATIONS

U.S. Appl. No. 14/745,217: "Method of ONO Stack Formation", Krishnaswamy Ramkumar, filed Jun. 19, 2015; 46 pages.
(Continued)

*Primary Examiner* — Cheung Lee

(57) ABSTRACT

A method of controlling the thickness of gate oxides in an integrated CMOS process which includes performing a two-step gate oxidation process to concurrently oxidize and therefore consume at least a first portion of the cap layer of the NV gate stack to form a blocking oxide and form a gate oxide of at least one metal-oxide-semiconductor (MOS) transistor in the second region, wherein the gate oxide of the at least one MOS transistor is formed during both a first oxidation step and a second oxidation step of the gate oxidation process.

19 Claims, 9 Drawing Sheets

Related U.S. Application Data continuation of application No. 14/745,217, filed on Jun. 19, 2015, now Pat. No. 9,218,978.

(60) Provisional application No. 62/130,106, filed on Mar. 9, 2015.

(51) Int. Cl.

| | |
|---|---|
| *H01L 27/11563* | (2017.01) |
| *H01L 21/02* | (2006.01) |
| *H01L 29/792* | (2006.01) |
| *H01L 29/167* | (2006.01) |
| *H01L 29/51* | (2006.01) |

(56) References Cited

U.S. PATENT DOCUMENTS

| | | |
|---|---|---|
| 6,689,653 B1 | 2/2004 | Seah et al. |
| 6,946,349 B1 | 9/2005 | Lee et al. |
| 7,390,718 B2 | 6/2008 | Roizin et al. |
| 7,411,247 B2 | 8/2008 | Ogura et al. |
| 8,189,397 B2 | 5/2012 | Eitan et al. |
| 8,258,027 B2 | 9/2012 | Smith et al. |
| 8,592,891 B1 * | 11/2013 | Polishchuk ........ H01L 21/28282 257/324 |
| 2006/0091424 A1 | 5/2006 | Strassburg et al. |
| 2009/0242958 A1 * | 10/2009 | Kikuchi ............ H01L 21/28282 257/319 |
| 2011/0084329 A1 * | 4/2011 | You .................. H01L 27/11565 257/324 |
| 2013/0210209 A1 | 8/2013 | Ramkumar |

OTHER PUBLICATIONS

U.S. Appl. No. 14/942,773: "Method of ONO Stack Formation" Krishnaswamy Ramkumar et al., filed Nov. 16, 2015; 46 pages.

Hashim, et al., "Fabrication and characterization of ONO and tunnel oxide for 16k Flotox EEPROM cell", Semiconductor Physics, Quantum Electronics & Optoelectronics, 2004, vol. 7 No. 1 pp. 112-117.

International Search Report for International Application No. PCT/US15/62490 dated Feb. 3, 2016; 2 pages.

Japanese Exam Report for Japanese Patent Application No. 2016-568437 dated Jun. 20, 2017; 6 pages.

Jeong-Mo Hwang, "Bringing Non-Volatile Memory Blocks to SOCS Using the Sonos Process", Simtek Corporation; 11 pages.

SIPO Office Action for International Application No. CN2015800360955 dated Jul. 27, 2017; 6 pages.

USPTO Non Final Rejection for U.S. Appl. No. 14/942,773 dated May 6, 2016; 14 pages.

USPTO Notice of Allowance for U.S. Appl. No. 14/745,217 dated Aug. 21, 2015; 8 pages.

USPTO Notice of Allowance for U.S. Appl. No. 14/942,773 dated May 23, 2017; 8 pages.

USPTO Notice of Allowance for U.S. Appl. No. 14/942,773 dated Sep. 1, 2016; 8 pages.

Written Opinion of the International Searching Authority for International Application No. PCT/US15/62490 dated Feb. 3, 2016; 3 pages.

SIPO Office Action for Application No. 201580036095.5 dated Jun. 5, 2018; 3 pages.

* cited by examiner

METHOD OF ONO STACK FORMATION

PRIORITY

This application is a continuation of U.S. patent application Ser. No. 14/942,773, filed on Nov. 16, 2015, which is a continuation of U.S. patent application Ser. No. 14/745,217, filed on Jun. 19, 2015, now U.S. Pat. No. 9,218,978, issued on Dec. 22, 2015, which claims priority to U.S. Provisional Application No. 62/130,106, filed on Mar. 9, 2015, all of which are incorporated by reference herein in their entirety.

TECHNICAL FIELD

The present disclosure relates generally to semiconductor devices, and more particularly to memory cells and methods of manufacturing thereof including an embedded or integrally formed charge-trapping gate stack such as an oxide-nitride-oxide (ONO) stack into an existing complementary metal-oxide-semiconductor (CMOS) foundry logic technology.

BACKGROUND

For many applications, such as system-on-chip, it is desirable to integrate logic devices and interface circuits based upon metal-oxide-semiconductor field-effect transistors (MOSFET) and non-volatile memory (NVM) transistors on a single chip or wafer. This integration can seriously impact both the MOS transistor and NVM transistor fabrication processes. MOS transistors are typically fabricated using a standard or baseline complementary-metal-oxide-semiconductor (CMOS) process flows, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include non-volatile memory transistors, such as silicon-oxide-nitride-oxide-silicon (SONOS) based transistors, including charge-trapping gate stacks in which a stored or trapped charge changes a threshold voltage of the NVM transistor to store information as a logic 1 or 0. Charge-trapping gate stack formation involves the formation of a nitride or oxynitride charge-trapping layer(s) sandwiched between two dielectric or oxide layers typically fabricated using materials and processes that differ significantly from those of the baseline CMOS process flow, and which can detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration can seriously impact the baseline CMOS process flow, and generally requires a substantial number of mask sets and process steps, which add to the expense of fabricating the devices and can reduce yield of working devices.

Besides, it is imperative for the integrated fabrication process to be able to control the thickness of top oxide of NVM transistors in order to meet requirements such as threshold voltages $V_{ts}$ and/or equivalent oxide thickness (EOT) requirements while satisfying gate oxide thickness requirements of MOS transistors, especially if those MOS transistors are high voltage input/output (HV I/O) transistors.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
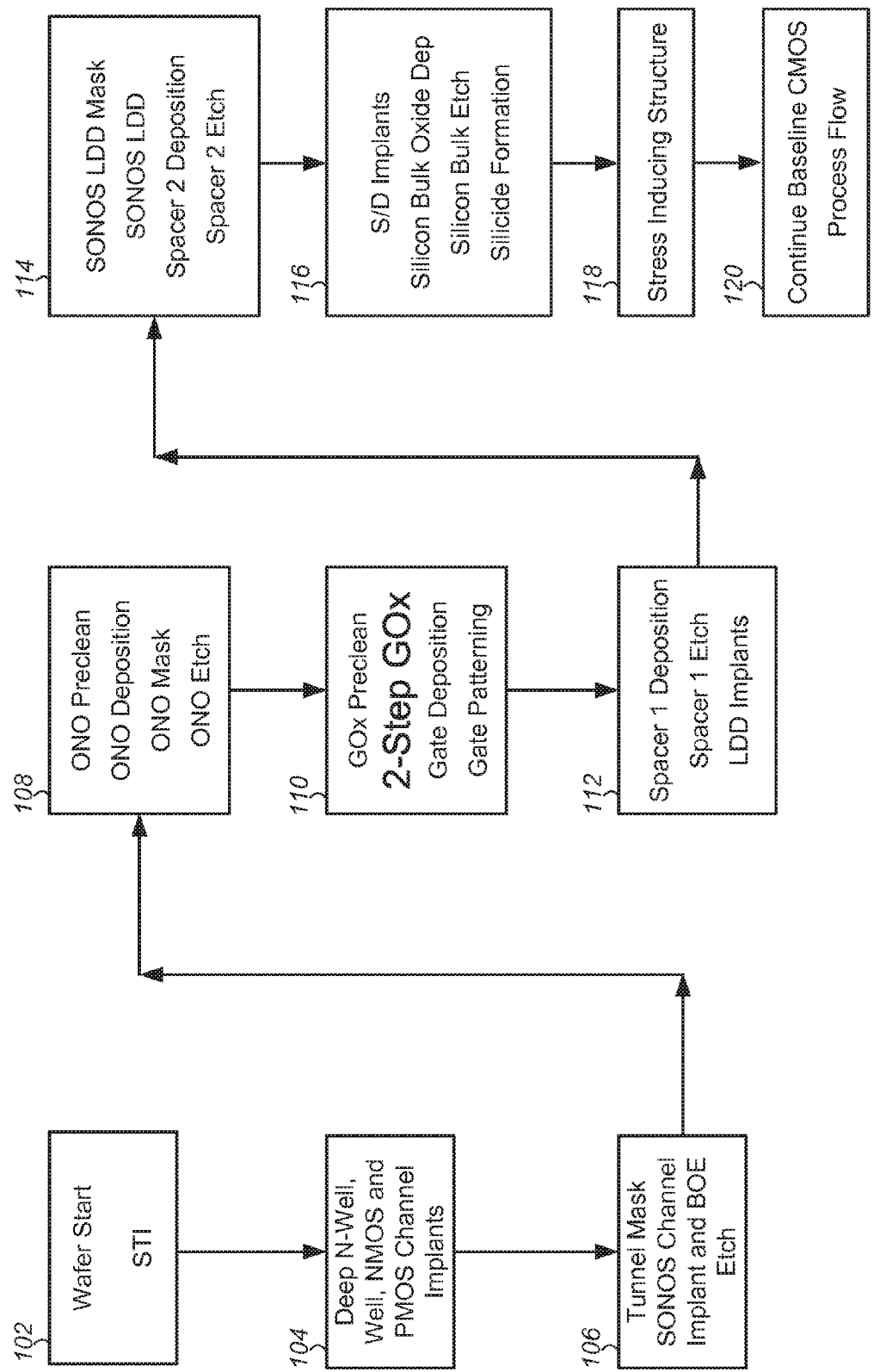
FIG. 1 is a flowchart illustrating an embodiment of a method for fabricating a memory cell including an embedded SONOS based NVM transistor and MOS transistors.

The following description sets forth numerous specific details such as examples of specific systems, components, methods, and so forth, in order to provide a good understanding of several embodiments of the present invention. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present invention.

Embodiments of a memory cell including an embedded non-volatile memory (NVM) transistor and a metal-oxide-semiconductor (MOS) transistor and methods of fabricating the same are described herein with reference to figures. However, particular embodiments may be practiced without one or more of these specific details, or in combination with other known methods, materials, and apparatuses. In the following description, numerous specific details are set forth, such as specific materials, dimensions, concentrations and processes parameters etc. to provide a thorough understanding of the present invention. In other instances, well-known semiconductor design and fabrication techniques have not been described in particular detail to avoid unnecessarily obscuring the present invention. Reference in the description to "an embodiment", "one embodiment", "an example embodiment", "some embodiments", and "various embodiments" means that a particular feature, structure, or characteristic described in connection with the embodiment(s) is included in at least one embodiment of the invention. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting wafer without consideration of the absolute orientation of the wafer.

Figure 2A:
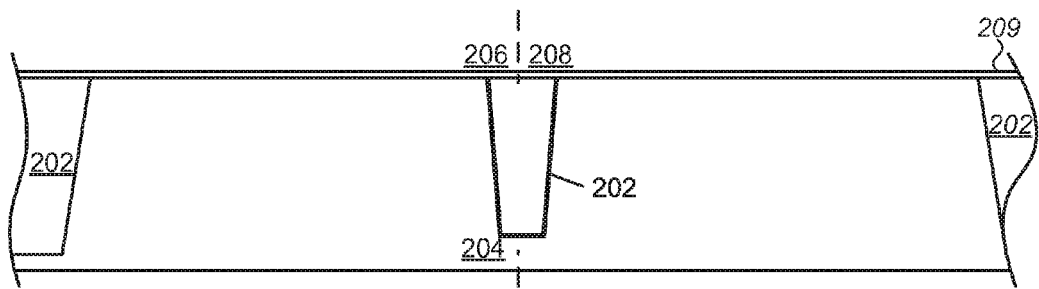
FIGS. 2A-2N are representative diagrams illustrating cross-sectional views of a portion of a memory cell during fabrication of the memory cell according to the method of FIG. 1.

The NVM transistor may include memory transistors or devices implemented related to Silicon-Oxide-Nitride-Oxide-Silicon (SONOS) or floating gate technology. An embodiment of a method for integrating or embedding a NVM transistor into a standard or baseline CMOS process flow for fabricating one or more MOS transistors will now be described in detail with reference to FIG. 1 and FIGS. 2A through 2N. FIG. 1 is a flowchart illustrating an embodiment of a method or process flow for fabricating the memory cell. FIGS. 2A-2N are block diagrams illustrating cross-sectional views of a portion of a memory cell during fabrication of the memory cell according to the method of FIG. 1. FIG. 2O is a representative diagram illustrating a cross-sectional view of a portion of an embodiment of the finished memory cell.

Referring to FIG. 1 and FIG. 2A, the process begins with forming a number of isolation structures 202 in a substrate or wafer 204 (step 102). The isolation structures 202 isolate the memory cell being formed from memory cells formed in adjoining areas (not shown) of the wafer 204. Optionally and additionally, isolation structures 202 may be incorporated to isolate the NVM transistor being formed in a first region 206 of the wafer 204 from one or more of the MOS transistors being formed in a second region 208. In one embodiment, the isolation structures 202 may include a dielectric material, such as an oxide or nitride, and may be formed by any conventional technique, including but not limited to shallow trench isolation (STI) or local oxidation of silicon (LOCOS). The wafer 204 may be a bulk wafer composed of any single crystal material suitable for semiconductor device fabrication, or may include a top epitaxial layer of a suitable material formed on a wafer. In one embodiment, suitable materials for the wafer 204 include, but are not limited to, silicon, germanium, silicon-germanium or a Group III-V compound semiconductor material.

Figure 2B:
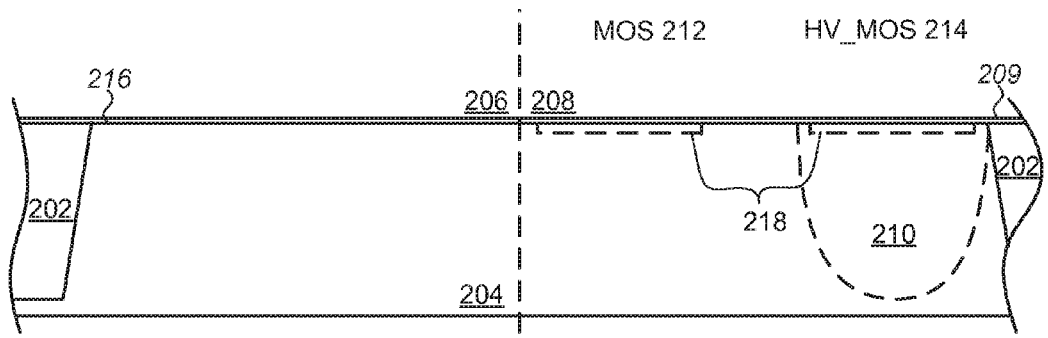
FIG. 2O is a representative diagram illustrating a cross-sectional view of a portion of a finished memory cell including an embedded SONOS based NVM transistor and MOS transistors fabricated according to the method of FIGS. 1 and 2A-2N.

Generally and optionally, as best shown in FIG. 2B, a pad oxide 209 may be formed over a surface 216 of the wafer 204 in both the first region 206 and the second region 208. In one embodiment, pad oxide 209 may be silicon dioxide ($SiO_2$) having a thickness of from about 10 nanometers (nm) to about 20 nm and may be grown by a thermal oxidation process or in-situ steam generation (ISSG) process.

Referring to FIG. 1 and FIG. 2B, dopants are then implanted into wafer 204 through pad oxide 209 to form wells in which the NVM transistor and/or the MOS transistors will be formed, and channels for the MOS transistors (step 104). The dopants implanted may be of any type and concentration, and may be implanted at any energy, including energies necessary to form wells or deep wells for the NVM transistor and/or the MOS transistors, and to form channels for the MOS transistors. In a particular embodiment, illustrated in FIG. 2B as an example, dopants of an appropriate ion species are implanted to form a deep N-well 210 in the second region 208 over or in which a high-voltage (HV) MOS transistor 214, such as a MOS input/output (I/O) transistor, will be formed. In alternative embodiments, wells or deep wells can also be formed for the NVM transistor and/or a standard or low-voltage (LV) MOS transistor, such as a MOS transistor 212. It is further to be appreciated that the wells are formed by depositing and patterning a mask layer, such as a photoresist layer above the surface 216 of the wafer 204, and implanting an appropriate ion species at an appropriate energy to an appropriate concentration.

In one embodiment, channels 218 for one or more of the MOS transistors 214, 212, are formed in the second region 208 of the wafer 204. As with the well implant the channels 218 are formed by depositing and patterning a mask layer, such as a photoresist layer above the surface 216 of the wafer 204, and implanting an appropriate ion species at an appropriate energy to an appropriate concentration. For example, $BF_2$ can be implanted at an energy of from about 10 to about 100 kilo-electron volts (keV), and a dose of from about 1e12 $cm^{-2}$ to about 1e14 $cm^{-2}$ to form an N-type MOS (NMOS) transistor. A P-type MOS (PMOS) transistor may likewise be formed by implantation of Arsenic or Phosphorous ions at any suitable dose and energy. It is to be appreciated that implantation can be used to form channels 218, in both of the MOS transistors 214, 212, at the same time, or at separate times using standard lithographic techniques, including a patterned photoresist layer to mask one of the channels for the MOS transistors.

Figure 2C:
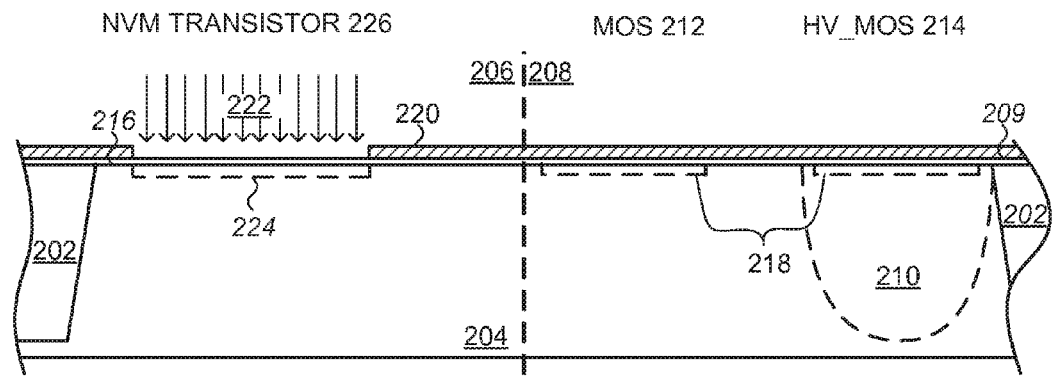

Next, referring to FIG. 1 and FIG. 2C, a patterned tunnel mask 220 is formed on or overlying the pad oxide 209, ions (represented by arrows 222) of an appropriate, energy and concentration are implanted through a window or opening in the tunnel mask to form a channel 224 for a NVM transistor 226, and the tunnel mask and the pad oxide in at least the second region 208 removed (step 106). The tunnel mask can include a photoresist layer, or a hard mask formed, from a patterned nitride or silicon-nitride layer.

In one embodiment, the channel 224 for the NVM transistor 226 is a deep Indium doped channel implanted with Indium (In) at an energy of from about 50 to about 500 kilo-electron volts (keV), and a dose of from about 5e11 $cm^{-2}$ to about 1e13 $cm^{-2}$ to form an n-channel NVM transistor. In one embodiment, implanting Indium to form the channel 224 of the NVM transistor 226 improves the threshold voltage (VT) uniformity of the NVM transistor from a sigma of VT from about 150 millivolts (mV) to from about 70 to 80 mV. Optionally or additionally, a shallow doped channel is implanted with Arsenic at an energy about 20 keV and a dose of from about 5e11 $cm^{-2}$ to about 1e13 $cm^{-2}$ at channel 224. Alternatively, $BF_2$ may be implanted to form an n-channel NVM transistor, or Arsenic or Phosphorous implanted to form a p-channel NVM transistor. In one alternative embodiment, channel for NVM transistor 226 may also be formed concurrently with channels 218 of the MOS transistors 214, 212.

A photoresist tunnel mask 220 can be ashed or stripped using oxygen plasma. A hard mask can be removed using a wet or dry etch process. The pad oxide 209 is removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Referring to FIG. 1 and FIGS. 2D-2F, the surface 209 of the wafer 204 is cleaned or precleaned, a number of dielectric layers, such as oxide-nitride-oxide or ONO layers or oxide-nitride-oxide-nitride-oxide or ONONO layers, formed or deposited, a mask formed on or overlying the dielectric layers, and the dielectric layers etched to form a dielectric gate stack 236 in the first region 206 (step 108). The preclean can be a wet or dry process and in this embodiment is wet process using HF or standard cleans (SC1) and (SC2), and is highly selective to the material of the wafer 204. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Figure 2D:
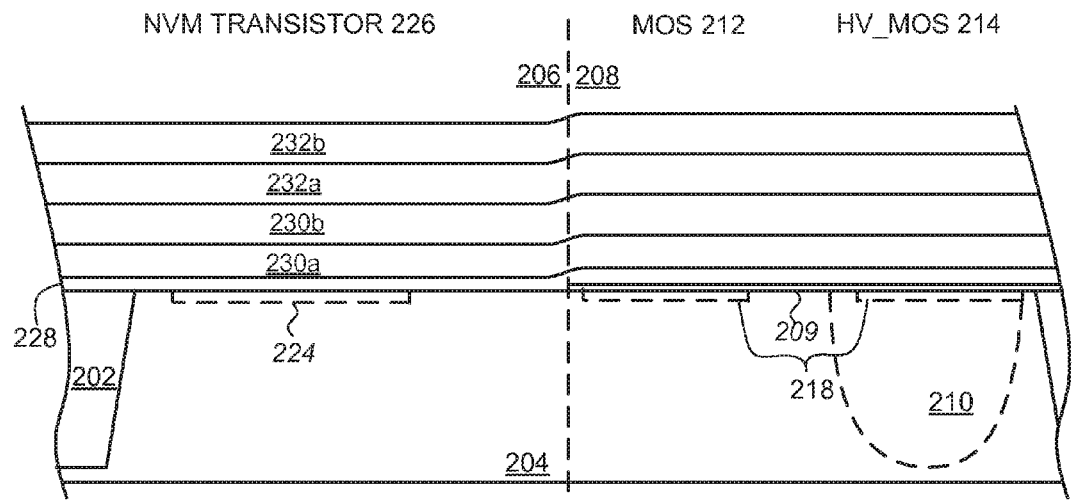

Referring to FIG. 2D, the dielectric or ONO or ONONO deposition begins with the formation of a tunnel dielectric 228 over at least the channel 224 of the NVM transistor 226 in the first region 206 of the wafer 204, and may spread over to the second region 208 of wafer 204 where MOS transistor(s) is. The tunnel dielectric 228 may be any material and have any thickness suitable to allow charge carriers to tunnel into an overlying charge-trapping layer under an applied gate bias while maintaining a suitable barrier to leakage when the NVM transistor is unbiased. In certain embodiments, tunnel dielectric 228 is silicon dioxide, silicon oxy-nitride, or a combination thereof and can be grown by a thermal oxidation process, using ISSG or radical oxidation.

In one embodiment a silicon dioxide tunnel dielectric 228 may be thermally grown in a thermal oxidation process. For example, a layer of silicon dioxide may be grown utilizing dry oxidation at 750° C.-800° C. in an oxygen containing gas or atmosphere, such as oxygen ($O_2$) gas. The thermal oxidation process is carried out for a duration approximately in the range of 50 to 150 minutes to effect growth of a tunnel dielectric 228 having a thickness of from about 1.0 nanometers (nm) to about 3.0 nm by oxidation and consumption of the exposed surface of wafer.

In another embodiment, a silicon dioxide tunnel dielectric 228 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an $HO_2$ radical or an O diradical, at the surface of wafer. The radical oxidation process is carried out for a duration approximately in the approximate range of about 1 to about 10 minutes to effect growth of a tunnel dielectric 228 having a thickness of from about 1.0 nanometers (nm) to about 4.0 nm by oxidation and consumption of the exposed surface of wafer. It will be understood that in FIG. 2D and in subsequent figures the thickness of tunnel dielectric 228 is exaggerated relative to the pad oxide 209, which is approximately 7 times thicker, for the purposes of clarity. In one embodiment, a tunnel dielectric 228 grown in a radical oxidation process may be both denser and composed of substantially fewer hydrogen atoms/$cm^3$ than a tunnel dielectric formed by wet oxidation techniques, even at a reduced thickness. In certain embodiments, the radical oxidation process is carried out in a batch-processing chamber or furnace capable of processing multiple wafers to provide a high quality tunnel dielectric 228 without impacting the throughput (wafers/hr.) requirements that a fabrication facility may require.

In another embodiment, tunnel dielectric layer 228 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel dielectric 228 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2D, a charge-trapping layer is formed on or overlying the tunnel dielectric 228. Generally, as in the embodiment shown, the charge-trapping layer is a multi-layer charge-trapping layer 230 comprising multiple layers including at least a lower or first charge-trapping layer 230 a which is closer to the tunnel dielectric 228, and an upper or second charge-trapping layer 230 b that is oxygen-lean relative to the first charge-trapping layer and comprises a majority of a charge traps distributed in multi-layer charge-trapping layer.

The first charge-trapping layer 230 a of a multi-layer charge-trapping layer 230 may include a silicon nitride ($Si_3N_4$), silicon-rich silicon nitride or a silicon oxy-nitride ($SiO_xN_y$ (HO)) layer. For example, the first charge-trapping layer 230 a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 230 b of the multi-layer charge-trapping layer 230 is then formed, either directly or indirectly, over the first charge-trapping layer 230 a. In one embodiment, the second charge-trapping layer 230 b may include a silicon nitride and silicon oxy-nitride layer having a stoichiometric composition of oxygen, nitrogen and/or silicon that is different from that of the first charge-trapping layer 230 a. The second charge-trapping layer 230 b may include a silicon oxynitride layer having a thickness of between about 2.0 nm and about 8.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 230 a&b may be identical or approximate to one another.

In another embodiment, there may be a dielectric and/or oxide layer (not shown) formed between the first and second charge-trapping layers 230a and 230b, making the multi-layer charge trapping layer 230 an NON stack. In some embodiments, the multi-layer charge-trapping layer 230 is a split charge-trapping layer, further including a thin, middle oxide layer (not shown) separating the first (lower) and second (upper) charge-trapping layers 230a and 230b. The middle oxide layer substantially reduces the probability of electron charge that accumulates at the boundaries of the second charge-trapping layer 230b during programming from tunneling into the first charge-trapping layer 230a, resulting in lower leakage current than for the conventional memory devices. In one embodiment, the middle oxide layer is formed by oxidizing to a chosen depth using thermal or radical oxidation. Radical oxidation may be performed, for example, at a temperature of 1000-1100° C. using a single wafer tool, or 800-900° C. using a batch reactor tool. A mixture of $H_2$ and $O_2$ gasses may be introduced to a process chamber at a ratio of approximately 1:1 and 10-15 Torr using a single wafer tool, or a pressure of 300-500 Torr for a batch process, for a time of 1-2 minutes using a single wafer tool, or 30 min to 1 hour using a batch process. In some embodiments, the radical oxidation process is without an ignition event, such as forming of plasma, which would otherwise typically be used to pyrolyze the $H_2$ and $O_2$ to form steam. Instead, the $H_2$ and $O_2$ is permitted to react at a surface of the first charge-trapping layer 230a to form radicals, such as, an OH radical, an $HO_2$ radical or an O diradical, to form the middle oxide layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 2D, the number of dielectric layers further includes a cap layer 232 that is formed on or overlying the charge-trapping layer 230. In one embodiment, the cap layer 232 includes a silicon nitride all or part of which is subsequently oxidized to form a blocking oxide overlying the charge-trapping layer 230. In a few embodiments, cap layer 232 may be a single layer of nitride (not shown) having a homogeneous composition, a single layer of nitride having a gradient in stoichiometric composition, or, as in the embodiment shown, may be a multi-layer cap layer including at least a lower or first cap layer 232a overlying the second charge-trapping layer 230b, and an upper or second cap layer 232b overlying the first cap layer 232a.

In one embodiment, the first cap layer 232a can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Similarly, the second cap layer 232b can also include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures. Optionally, the first cap layer 232a and second cap layer 232b may comprise different stoichiometric ratio. For example, the second cap layer 232b may comprise a silicon or oxygen rich composition relative to the first cap layer 232a to facilitate removal of the second cap layer in a dry or wet clean process prior to oxidizing the first cap layer 232a. Alternatively, the first cap layer 232a may comprise a silicon or oxygen rich composition relative to the second cap layer 232 b to facilitate oxidation of the first cap layer 232a.

Figure 2E:
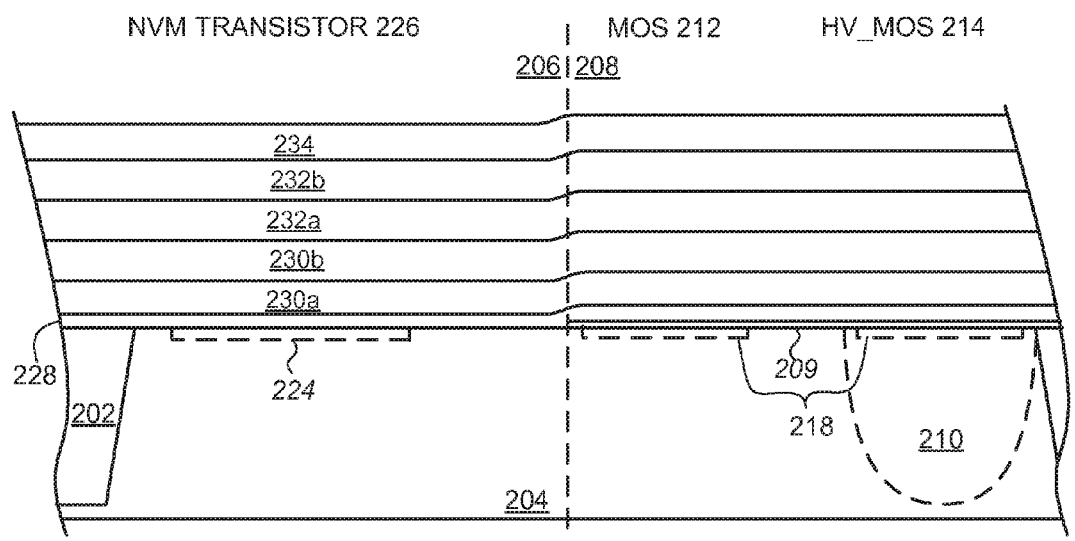

Referring to FIG. 2E, a sacrificial oxide layer 234 is formed on or overlying the second cap layer 232b. In one embodiment, the sacrificial oxide layer 234 may be formed or deposited by a chemical vapor deposition process in a low pressure chemical vapor deposition (LPCVD) chamber. For example, the sacrificial oxide layer 234 may be deposited by a CVD process using a process gas including gas mixtures of silane or dichlorosilane (DCS) and an oxygen containing gas, such as $O_2$ or $N_2O$, in ratios and at flow rates tailored to provide a silicon dioxide ($SiO_2$) sacrificial oxide layer. In another embodiment, the sacrificial oxide layer 234 may include a silicon dioxide layer grown by a thermal oxidation process, in-situ steam generation (ISSG), or radical oxidation, and having a thickness of approximately between 2.0 nm and 4.0 nm.

Figure 2F:
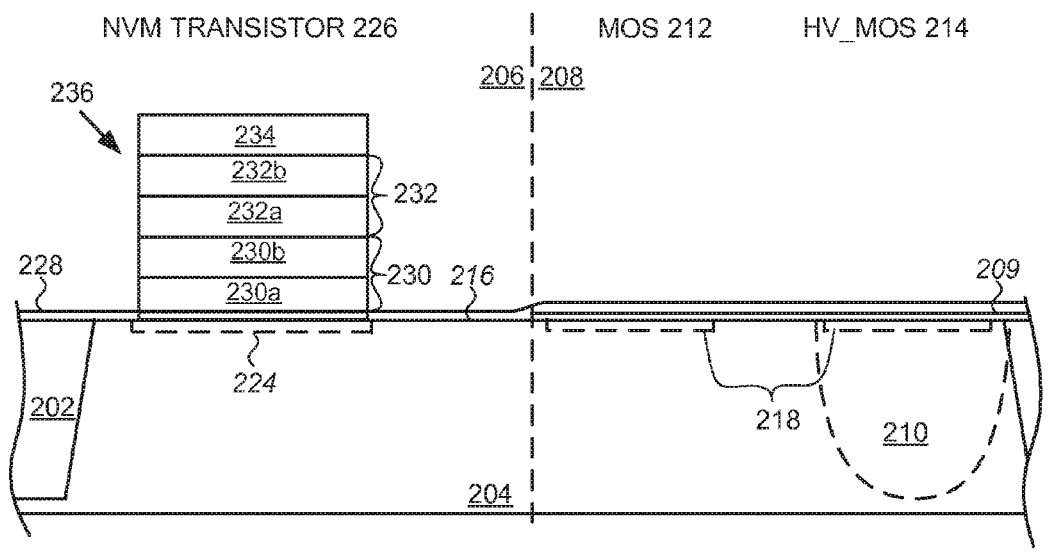

Referring to FIG. 2F, a patterned mask layer (not shown) is formed on or overlying the sacrificial oxide layer 234. Subsequently, the sacrificial oxide layer 234, cap layers 232a&b, and the charge-trapping layers 230a&b are etched or patterned to form a gate stack 236 overlying the channel 224 of the NVM transistor 226 and sacrificial oxide layer 234, cap layers 232a&b, and charge trapping layers 230a&b from the second region 208 of the wafer 204 are removed. In one embodiment, the patterned mask layer (not shown) may include a photoresist layer patterned using standard lithographic techniques, and sacrificial oxide layer 234, cap layer 232, and charge trapping layer 230 may be etched or removed using a dry etch process including one or more separate steps to stop at tunnel dielectric layer 228 or proximate to surface 216 of wafer 204.

Figure 2G:
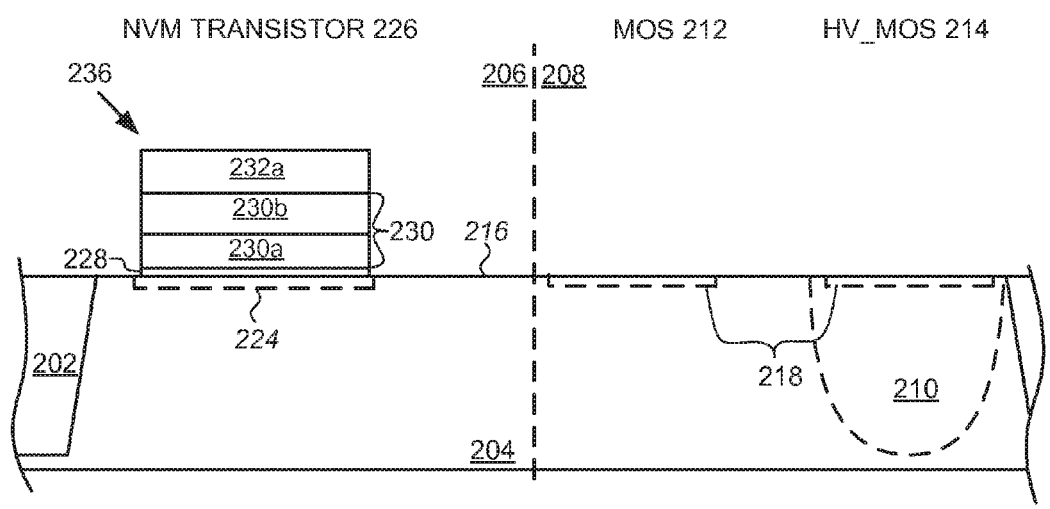

Referring to FIG. 1, a gate oxide or GOX preclean is performed, gate oxides for both MOS transistors 214, 212 formed, and a gate layer is deposited and patterned to form gates for the NVM transistor 226, and both MOS transistors (step 110). Referring to FIG. 2G, during the GOX preclean process, sacrificial oxide layer 234 of gate stack 236 and a portion of the cap layer 232 or substantially of all of a top most layer, such as second cap layer 232b, in a multi-layer cap layer 232 are removed from the gate stack 236 in a highly selective cleaning process. In certain embodiments, the highly selective cleaning process may even remove a portion of first cap layer 232a. In one embodiment, this cleaning process may simultaneously or concurrently further remove any residual oxide, such as an oxide tunnel dielectric 228 and pad oxide 209, remaining in the first region 206 outside of the gate stack 236 and in the second region 208 to prepare the wafer 204 in that region for gate oxide growth. In one embodiment, the thickness of cap layer 232 is adjusted to allow a portion or substantially all of second cap layer 232 b, may even be a portion of first cap layer 232a, to be consumed by the GOX preclean. In one embodiment, sacrificial oxide layer 234 and second cap layer 232b are removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

This embodiment of the GOX preclean is advantageous in that it substantially does not affect the baseline CMOS process, either in the preclean step (step 110) or a subsequent oxidation step (step 112), but rather uses it for the integration of the NVM transistor fabrication.

Figure 2H:
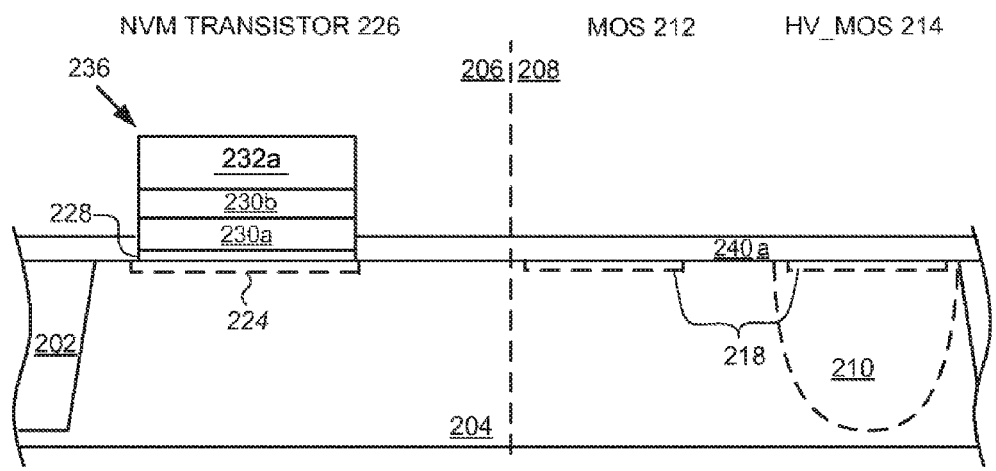
Figure 2I:
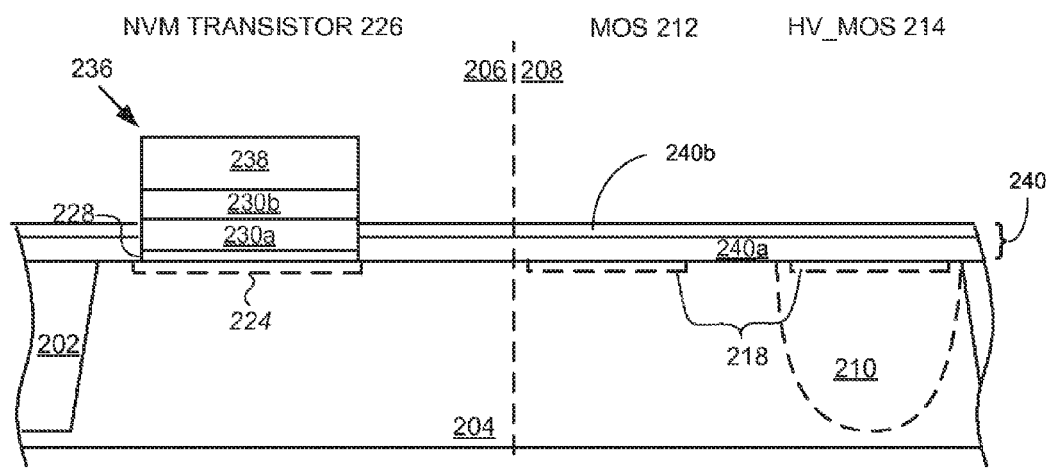

Referring to FIGS. 2H and 2I, in one embodiment, a two-step oxidation process is performed consecutively to oxidize at least the remaining portion of the cap layer 232 or the first cap layer 232 *a* of a multi-layer cap layer, or a portion of the second charge-trapping layer 230 *b* to form a blocking oxide layer 238 overlying the second charge-trapping layer 230*b*. In one embodiment, the two-step oxidation process is adapted to oxidize the first cap layer 232 *a* to form the blocking oxide layer 238 while simultaneously or concurrently oxidizing at least a portion of the surface 216 of the wafer 204 in the second region 208 to form gate oxide 240 overlying at least the channel 218 of at least one MOS transistor. Accordingly, in general it is imperative to be able to configure the two-step oxidation process in order to grow both top oxide layer of the NVM transistor 226 and gate oxide(s) of the MOS transistor(s) 212, 214 to their respective desirable operational thicknesses. In one embodiment, gate oxide thicknesses are such that the final top oxide of NVM transistor 226 was approximately 30-45 Å thick in order to meet the requirements for the reliability of the ONO stack. However, in some other embodiments, the MOS transistor(s) may be an I/O transistor in which their I/O gate oxide is required to be much thicker in order to support a higher I/O voltage. For instance, in one embodiment, one of the MOS transistors in the region 208 is a high voltage I/O transistor and thus requires a thick gate oxide (over 100 Å to 200 Å). In such process flows, while the I/O gate oxide may achieve its required thickness, since they are subjected to the same environment during oxidation of the gate oxide of MOS transistor(s), top oxide of the NVM transistor 226 may be grown too thick. As a result, the NVM transistor 226 may not meet the requirements for effective oxide thickness (EOT) and program/erase $V_{ts}$. Alternatively, the deposited top oxide may be protected and be the top oxide in the final NVM stack, the reliability of the NVM stack may however be negatively impacted by the inferior quality top oxide.

Therefore, in one embodiment, a novel two-step oxidation process is proposed to ensure desirable top oxide 238 of NVM transistor 226 and gate oxide 240 of MOS transistor(s) thicknesses are both achieved while maintain the quality of the grown oxide layers. In one embodiment, the first step is a rapid thermal dry oxidation (RTO) and the second step is a rapid and radical wet oxidation such as in-situ steam generation (ISSG). Referring to FIG. 2H, the oxidation process starts with dry RTO performed in a batch or single wafer processing chamber with or without an ignition event such as plasma. For example, in one embodiment, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr to form a bottom layer of first gate oxide 240*a*. In one embodiment, a bottom layer of first gate oxide 240*a* is grown, by oxidizing silicon wafer 204, on at least a portion of the surface 216 of the wafer 204 in the second region 208 overlying at least the channel 218 of at least one MOS transistor, and in the first region 206 outside of gate stack 236. However, in one embodiment, the dry RTO process has very little to no effect on first cap layer 232 *a* of ONO gate stack 236, which is a nitride or oxynitride, and virtually no oxide is grown on gate stack 236. In one alternative embodiment, dry RTO process may be substituted with a rapid molecular oxidation (dry or wet) which is a non-radical oxidation process. Since there is no radical formed during the process, the first cap layer 232 *a*, which is a nitride or oxynitride, will have virtually no oxide grown on gate stack 236 while a bottom layer of first gate oxide 240*a* is formed, on at least a portion of the surface 216 of the wafer 204 in the second region 208 overlying at least the channel 218 of at least one MOS transistor. In one embodiment, after the dry RTO oxidation process, or one of its alternative oxidation processes, a bottom layer of first gate oxide 240*a* may have a thickness of from about 85 Å to about 95 Å and more.

After a desirable thickness of first gate oxide bottom layer 240*a* is grown, the oxidation process may progress immediately to a separated step of a second wet rapid and radical oxidation process such as in-situ steam generation (ISSG). Referring to FIG. 2I, for example, wet rapid and radical oxidation may be performed in a batch or single wafer processing chamber with or without an ignition event such as plasma. For example, in one embodiment the blocking oxide layer 238 and a top layer of first gate oxide 240*b* may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr to form radicals, such as, an OH radical, an $HO_2$ radical or an O diradical radicals at a surface of the cap layer 232 or the first cap layer 232*a*. The oxidation process is carried out for a duration approximately in the range of 1-5 minutes for a single wafer using an ISSG process, or 30-120 minutes for a batch furnace process to effect growth of a blocking oxide layer 238 by oxidation and consumption of the first cap layer 232*a* and may be a portion of the second charge-trapping layer 230*b*. During the same period, a top layer of first gate oxide 240*b* is grown on the first gate oxide bottom layer 240*a* in the second region 208 overlying at least the channel 218 of at least one MOS transistor. In one embodiment, after the second wet radical oxidation process such as ISSG, blocking oxide layer 238 may have a thickness of from about 30 Å to about 45 Å. Simultaneously, first gate oxide top layer 240*b* is grown to complete formation of gate oxide layer 240 to a thickness of from about 105 Å to about 200 Å. In alternative embodiments, the second step wet rapid and radical oxidation may be substituted by processes such as chemical vapor deposition (CVD), or other radical oxidation processes performed in a batch or single wafer processing chamber with or without an ignition event such as plasma as long as oxide will be grown or deposited both on gate stack 236 of NVM transistor and first gate oxide bottom layer 240*a* of MOS transistor(s) simultaneously. In one embodiment, after the two step oxidation process as previously described, the thickness ratio between top oxide 238 of NVM transistor and gate oxide 240 of at least one of the MOS transistor is in an approximate range of 1:2.33 (105 nm/45 nm) to 1:6.67 (200/30 nm).

In one embodiment, by controlling the parameters in the first step dry RTO process and the second step wet ISSG process such as time duration, temperature, pressure, reactants etc., targeted thicknesses of blocking oxide layer 238 of NVM transistor in the first region 206 and gate oxide layer 240 of at least one MOS transistor in the second region 208 are achieved. The following table illustrates an example of implementation of the proposed two-step oxidation process:

| Oxidation Process | Grown Oxide (Silicon) Thickness | Top Oxide (SONOS) Thickness | Gate Oxide (MOS) Thickness |
| --- | --- | --- | --- |
| Dry RTO | 100 Å | 0 Å | 95 Å |
| Wet ISSG | 70 Å | 45 Å | 115 Å |

In this example, the dry RTO process (first oxidation step) that grows about 100 Å of oxide on silicon, may grow about 95 Å of oxide in the second region 208 on the wafer 204 and has very little effect on the first cap layer 232a which is a nitride or oxynitride. The wet ISSG process (second oxidation step), which normally grows 70A of oxide on silicon, builds the thickness of gate oxide 240 in the second region 208 on the wafer 204 up to approximately 115 Å which may be the target for a HV I/O gate oxide in one embodiment. The top oxide of the ONNO or ONONO gate stack 236 grows only during the wet ISSG process. For 70 Å oxidation on silicon, approximately 45 Å oxide is grown on by consuming the nitride in first cap layer 232a and maybe second charge trapping layer 230b of gate stack 236. In one embodiment, a target thickness of about 45 Å for a top oxide of a SONOS may be desirable to meet EOT and $V_{ts}$ requirements. In other embodiments, parameters of the rapid dry thermal oxidation and radical wet oxidation may be adjusted to attain desirable top oxide thicknesses for the NVM transistor and MOS transistor in one single process. Besides, using rapid thermal processes for both oxidations minimizes the interaction between the STI gapfill dielectric, such as dielectric in isolation structures 202 and the ONO stack. It minimizes the moisture in the gap fill dielectric from getting out and affecting the ONO thicknesses which may impact the $V_{ts}$ of the SONOS device.

In one embodiment, the two gate oxidation steps are carried out in single wafer tools. The dry thermal oxidation and wet radical oxidation processes can be either done in two different tools such as a rapid thermal anneal (RTA) single wafer tool for the dry RTO process and subsequently an ISSG single wafer tool for the ISSG process. Alternatively, dry and wet RTO may be carried out in one ISSG tool. In this particular embodiment, the oxidation is initially performed by raising the wafer temperature to 1000-1100° C. range and flowing $O_2$ only for a required amount of time to finish the dry RTO process. Subsequently, $H_2$ is introduced in order to start the ISSG oxidation. The operation temperature of the two oxidation steps is preferably kept at the same value.

In one alternative embodiment, the sequence of the dry RTO and wet ISSG oxidation steps may be reversed. The device is first subjected to wet ISSG oxidation either in a batch or single wafer processing chamber with or without an ignition event such as plasma, wherein top oxide 238' may be grown on both gate stack 236 of NVM transistor and first gate oxide bottom layer 240a' in the second region 208 overlying at least the channel 218 of at least one MOS transistor. The wet ISSG oxidation may be terminated when a desirable thickness of top oxide 238' of NVM transistor 236 is attained. Subsequently, a dry RTO step may begin to continue growing first gate oxide top layer 240b' on first gate oxide bottom layer 240a' until a desirable combined thickness of gate oxide 240 is attained. The dry RTO step has very little to no effect on the thickness of top oxide 238' of NVM transistor 236 that was grown during the wet ISSG oxidation.

In another alternative embodiment, both oxidation steps are done in ISSG process, hence both oxidation steps will oxidize first cap layer 232a of gate stack 236 of NVM transistor. In this embodiment, after the first ISSG oxidation step, a photomask is applied such that only gate stack 236 of NVM transistor regions is exposed by using photoresist. Using this photomask, a HF etch is carried out to remove only the oxide grown on and consuming a portion of the nitride in first cap layer 232a in NVM transistor. Following the edge process, the photoresist is removed and the wafer is subjected to a second wet ISSG process to form the rest of gate oxide 240 of MOS transistor and also form top oxide 238 of NVM transistor by consuming the rest of first cap layer 232a until a desirable thickness is attained. In this particular embodiment, an extra photomask may be required.

In some embodiments, as explained briefly above, the dry radical RTO step and/or wet radical ISSG oxidation step may be carried out at a batch furnace. In these embodiments, the process flow is the same but in each oxidation, a batch of wafers (100-125 wafers) are subjected to the oxidation concurrently. This embodiment assumes that a capable batch type tool for radical oxidation is available. For this scheme to be successful, the gap fill dielectric, such as dielectric in isolation structures 202 and the ONO stack, needs to be of high quality with zero or minimum moisture content.

In one embodiment, the grown gate oxide 240, which includes a layer of first gate oxide bottom layer 240a grown during the first oxidation step and first gate oxide top layer 240b during the second oxidation step, may or may not exhibit different stoichiometric ratio and/or structures between gate oxide layers 240a and 240b.

Figure 2J:
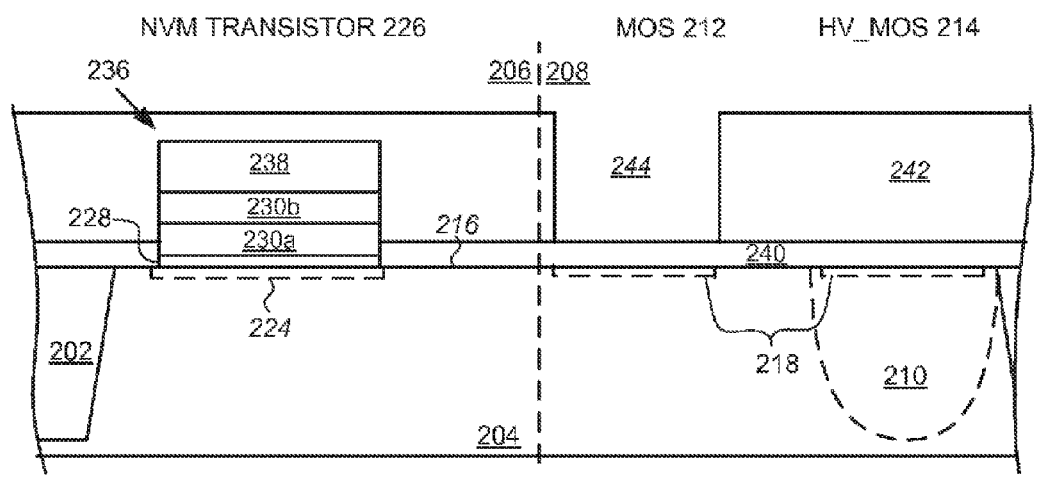
Figure 2K:
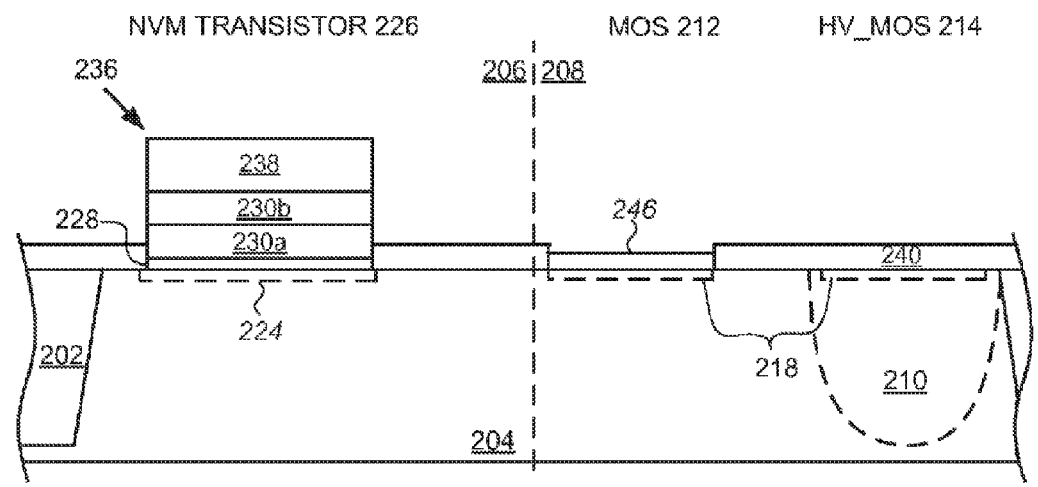
Figure 2L:
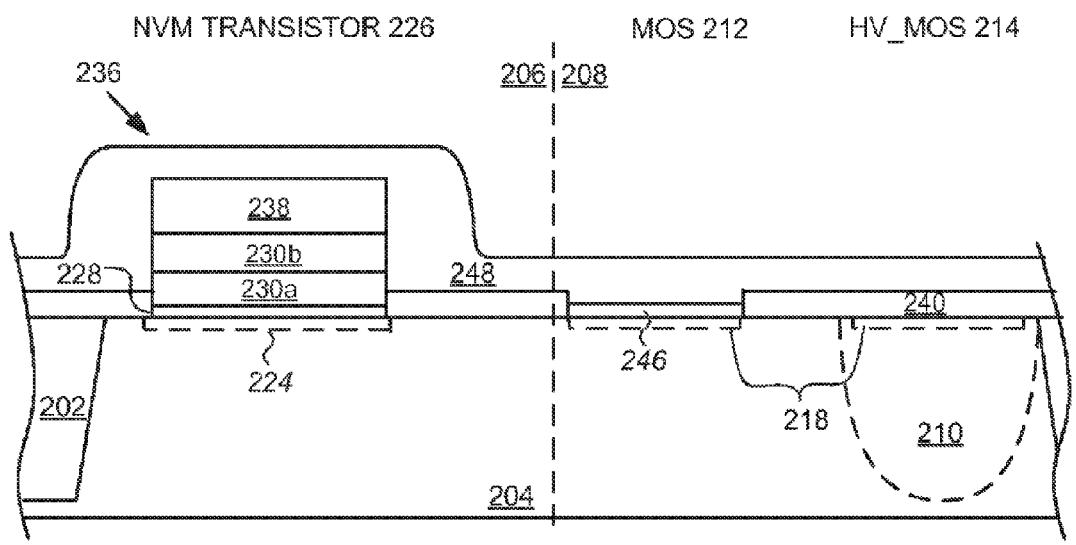
Figure 2M:
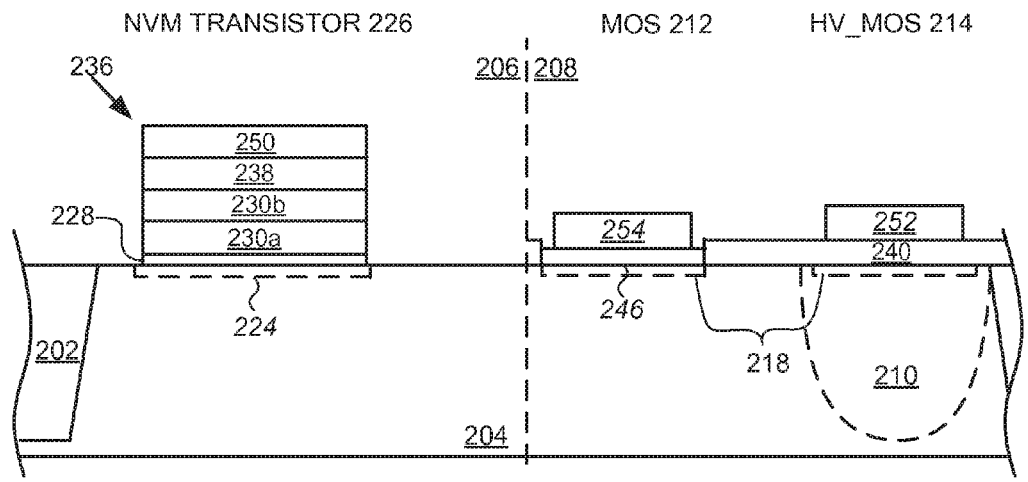
Figure 2N:
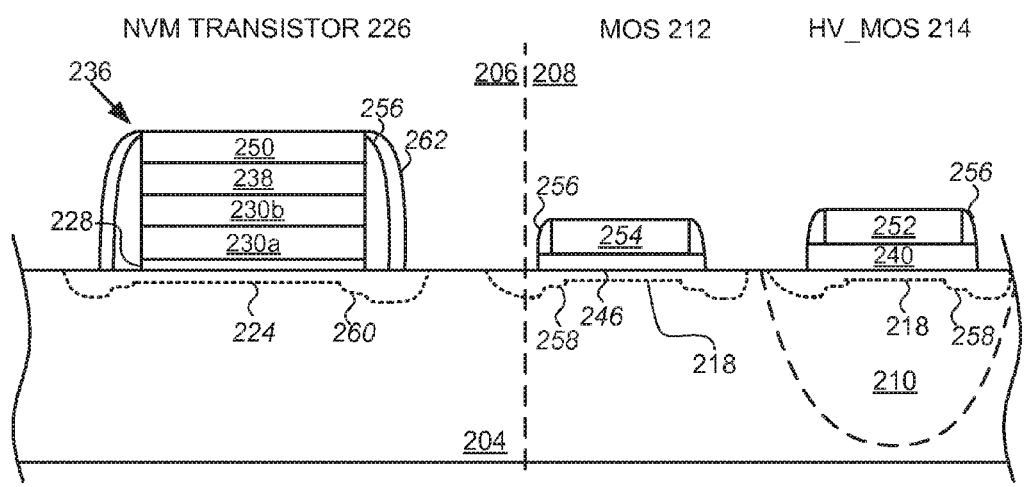
Figure 2O:
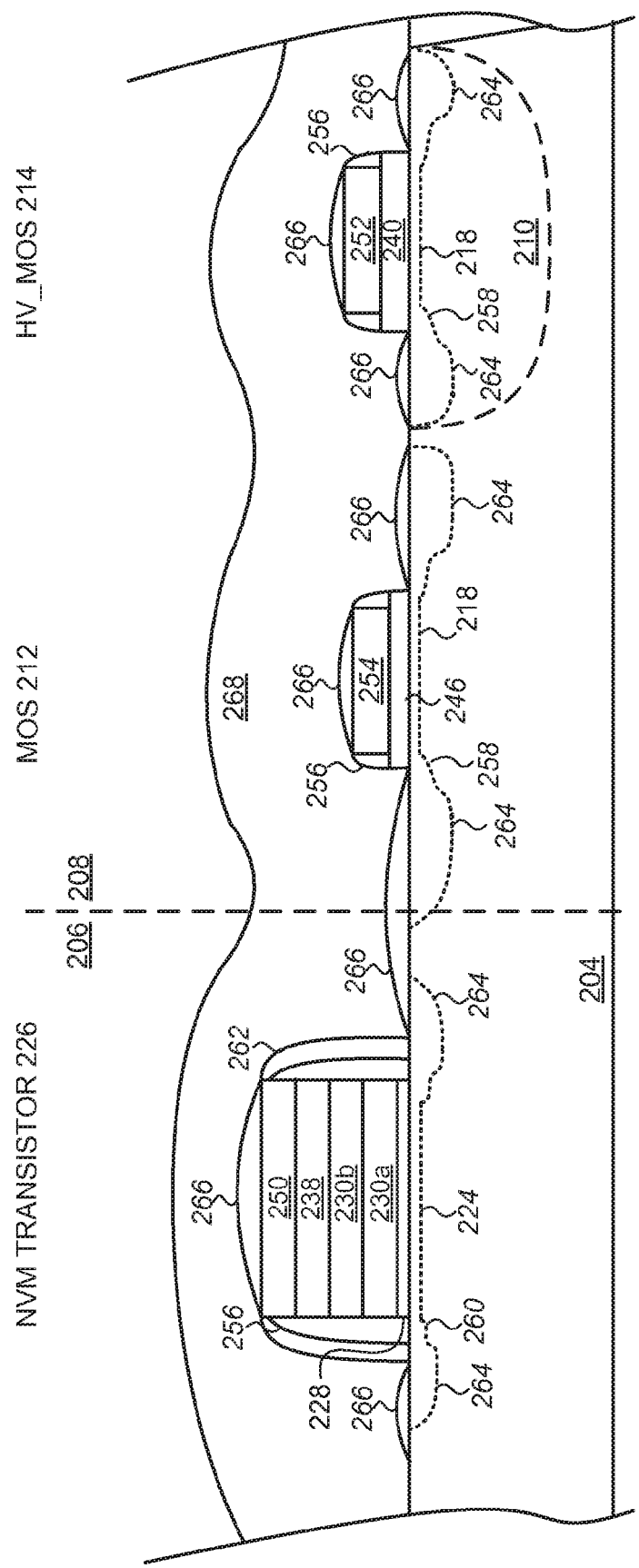

In some embodiments, such as that shown in FIGS. 2J to 2N, the method further includes a dual gate oxide process flow to enable fabrication of both a LV MOS transistor 212 and a HV MOS transistor 214. Referring to FIG. 2J, a patterned mask layer 242 is formed over the first and second regions 206, 208 of the wafer 204. The patterned mask layer 242 can be a photoresist layer patterned using standard lithographic techniques, and includes at least one opening 244 over a channel 218 in the second region 208. The thick, first gate oxide 240 is etched in the exposed regions by using a BOE etch, under conditions similar to those described above with respect to removing the sacrificial oxide layer 234, and the patterned mask layer 242 is then removed.

Referring to FIG. 2K, the wafer 204 is cleaned using a wet etch that does not etch oxide in order to protect the first gate oxide 240 of the HV MOS transistor 212, and the blocking oxide layer 238 of the gate stack 236. The wafer 204 is then subjected to a thermal oxidation process to grow a thin, second gate oxide 246 having an appropriate thickness, such as from about 1 nm to about 3 nm. In some embodiments, the second gate oxide 246 can be overlaid with a deposited layer (not shown) such as silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide.

Referring to FIG. 2L, a gate layer 248 of any conducting or semiconducting material suitable for accommodating a biasing of the NVM transistor 226 and operation of the MOS transistors 214, 212, is formed over the gate stack 236, the first gate oxide 240 of the HV MOS transistor 214, and the second gate oxide 246 of the MOS transistor 212. In one embodiment, the gate layer 248 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer is formed by a CVD process and is composed of a single doped polysilicon layer, which may then be patterned to form control gates of the NVM transistor 226 and MOS transistors 214, 212.

Referring to FIG. 2M, the gate layer 248 is patterned using a mask layer (not shown) and standard lithographic techniques to stop on surfaces of the blocking oxide layer 238, the first gate oxide 240 and the second gate oxide 246, thereby forming a gate 250 for the gate stack 236 of a NVM transistor 226, a gate 252 for the HV MOS transistor 214, and a gate 254 for the MOS transistor 212.

Referring to FIG. 1 and FIG. 2N, a first spacer layer is deposited and etched to form first sidewall spacers 256 adjacent to the gates 252, 254, of the MOS transistors 212, 214, and the NVM transistor 226, and one or more lightly-doped drain extensions (LDD 258) are implanted adjacent to and extend under sidewall spacers 256 of one or more of the MOS transistors 212, 214 (step 112).

Next, a SONOS LDD mask is formed over the wafer 204 and lightly-doped drain extensions (LDD 260) are implanted, adjacent to the NVM transistor 226. Finally, a second spacer layer is deposited and etched to form second sidewall spacers 262 adjacent to the gate stack 236, of the NVM transistor 226 (step 114).

In one or more alternative embodiments, fabrication steps as illustrated and described in FIGS. 1 to 2N may be adapted or modified to manufacture a floating gate based NVM transistor, instead of or additional of the SONOS based NVM transistor 226 in an integrated baseline CMOS process.

Referring to FIGS. 1 and 2O, with the NVM transistor 226, HV MOS transistor 214 and LV MOS transistor 212 substantially complete, source and drain implants are performed to form source and drain regions 264 for all transistors and a silicide process performed (step 116). As depicted, silicide regions 266 may be formed on the exposed gates 250, 252 and 254 and exposed source and drain regions 264. The silicide process may be any commonly employed in the art, typically including a pre-clean etch, cobalt or nickel metal deposition, anneal and wet strip.

Referring FIG. 1 and FIG. 2O, optionally the method of fabricating memory cells including an embedded or integrally formed SONOS based NVM transistor and MOS transistor(s) further includes the step of forming a stress inducing layer or structure 268, such as a stress inducing nitride layer, over the gate stack 236 of the NVM transistor 226 to increase data retention and/or to improve programming time and efficiency (step 118). In particular, inducing stress into the charge-trapping layer 230 of the NVM transistor 226 changes energy levels of charge traps formed therein, thereby increasing charge retention of the charge-trapping layer. In addition, forming a stress inducing structure 268, in or on the surface 216 of the wafer 204 proximal to, and preferably surrounding, a region of the wafer in which the channel 224 of NVM transistor 226 is formed will reduce the band gap, and, depending on the type of strain, increases carrier mobility. For example, tensile strain, in which inter-atomic distances in the crystal lattice of the wafer 204 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 226.

The strain inducing structure 268 can include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-Tertiary Butyl Amino Silane (BTBAS) nitride layer.

In certain embodiments, such as that shown in FIG. 2O, the stress inducing structure 268 may also be formed over one or more of the MOS transistors to induce strain in the channel of the MOS transistor.

Finally, the standard or baseline CMOS process flow is continued to substantially complete the front end device fabrication (step 120), yielding the structure shown in FIG. 2O. FIG. 2O is a block diagram illustrating a cross-sectional view of a portion of a finished memory cell including an embedded SONOS based NVM transistor and MOS transistors fabricated according to the method of FIGS. 1 and 2A-2N.

Thus, embodiments of memory cells including embedded or integrally formed SONOS based NVM transistor and MOS transistors and methods of fabricating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A device, comprising:
a non-volatile memory (NVM) transistor disposed in a first region of a substrate, the NVM transistor including a blocking oxide layer having a single-layer structure and a first thickness, and disposed in direct contact with a charge-trapping layer; and
first and second field-effect transistors (FETs) disposed in a second region of the substrate, wherein the first FET includes a first gate oxide layer having first and second sublayers, wherein the first FET is a high voltage (HV) transistor and the second FET is a low voltage (LV) transistor, and wherein the second sublayer has a second sublayer thickness corresponding to the first thickness of the blocking oxide of the NVM transistor.

2. The device of claim 1, wherein the first and second sublayers of the first gate oxide layer include two distinctively different stoichiometric ratios.

3. The device of claim 1, wherein the first sublayer of the first gate oxide is formed by a dry rapid thermal oxidation (RTO) process step and the second sublayer of the first gate oxide is formed by a wet in-situ steam generation (ISSG) process step.

4. The device of claim 3, wherein the first sublayer has a first sublayer thickness, wherein the first sublayer thickness is independent of the first thickness of the blocking oxide of the NVM transistor.

5. The device of claim 4, wherein the second FET includes a second gate oxide layer having a second gate oxide thickness, wherein the second gate oxide thickness is independent of the first thickness of the blocking oxide and the first and second sublayer thicknesses.

6. The device of claim 3, wherein the first sublayer is formed prior to the second sublayer.

7. The device of claim 3, wherein the second sublayer is formed prior to the first sublayer.

8. The device of claim 1, wherein the charge-trapping layer is disposed between the blocking oxide and the substrate and includes a multi-layer structure comprising at least:
   a lower charge-trapping layer over the tunneling dielectric, the lower charge-trapping layer comprising silicon nitride ($Si_3N_4$), silicon-rich nitride, silicon oxy-nitride ($SiO_xN_y(H_z)$) or a combination thereof; and
   an upper charge-trapping layer over the lower charge-trapping layer, the upper charge-trapping layer comprising silicon nitride, $SiO_xN_y(H_z)$ or a combination thereof,
   wherein the upper charge-trapping layer further includes a stoichiometric composition of oxygen, nitrogen or silicon content different from that of the lower charge-trapping layer, and
   wherein the upper charge-trapping layer is oxygen-lean compared to the lower charge-trapping layer.

9. The device of claim 1, further comprising:
a nitride structure disposed overlying the NVM transistor and portions of substrate proximal to a channel of the NVM transistor.

10. The device of claim 1, further comprising:
a nitride structure disposed overlying the first and second FETs.

11. The device of claim 1, wherein the first and second sublayers of the first gate oxide layer of the first FET are formed in two separate oxidation steps.

12. A device, comprising:
a non-volatile memory (NVM) transistor formed in a first region of a substrate, wherein the NVM transistor comprises a blocking oxide layer disposed adjacent to and in direct contact with a charge-trapping layer, and the charge-trapping layer disposed adjacent to a tunneling dielectric layer, and, wherein the blocking oxide has a single-layer structure and a first thickness;
a high voltage (HV) field-effect transistor (FET) and a low voltage (LV) FET disposed in a second region of the substrate, wherein the HV FET comprises a HV gate oxide layer having a second thickness and the LV FET comprises a LV gate oxide layer having a third thickness, and wherein the first thickness is corresponding to the second thickness, and the third thickness is independent of both the first and second thicknesses; and
a stress inducing nitride structure disposed overlying at least the NVM transistor and portions of the substrate surrounding a channel of the NVM transistor.

13. The device of claim 12, wherein the HV gate oxide layer further comprises a first sublayer formed by a dry rapid thermal oxidation (RTO) process step and a second sublayer formed by a wet in-situ steam generation (ISSG) process step.

14. The device of claim 13, wherein the blocking oxide layer of the NVM transistor is formed during the wet ISSG process step to attain the first thickness, and wherein the first thickness is corresponding to a thickness of the second sublayer of the HV gate oxide layer.

15. The device of claim 14, wherein the first thickness is independent of a thickness of the first sublayer of the HV gate oxide layer.

16. The device of claim 13, wherein the first and second sublayers of the HV gate oxide layer are formed separately, and have different composition of silicon and oxygen from one another.

17. A memory apparatus, comprising:
a substrate divided into a plurality of first regions and second regions, wherein,
in each first region of the plurality of first regions, a non-volatile memory (NVM) transistor is formed, wherein the NVM transistor comprises an NV gate stack including a tunneling dielectric layer, a charge-trapping layer, and a blocking oxide layer having a first thickness, wherein the blocking oxide has a single-layer structure and is disposed directly on the charge-trapping layer, and
in each second region of the plurality of second regions, at least one high voltage (HV) field-effect transistor (FET) and at least one low voltage (LV) FET are formed, wherein the at least one HV FET comprises a gate oxide including first and second sublayers, and wherein a thickness of the first sublayer is corresponding to the first thickness and a thickness of the second sublayer is independent of the first thickness.

18. The apparatus of claim 17, wherein the first sublayer is formed by a wet in-situ steam generation (ISSG) process step of a two-step oxidation process, and the second sublayer is formed by a dry rapid thermal oxidation (RTO) process step of the two-step oxidation process, wherein the ISSG process step and the RTO process step that are performed separately.

19. The apparatus of claim 17, wherein the first thickness is in an approximate range of 30 Å to 45 Å while the thickness of the second sublayer is in an approximate range of 105 Å to 200 Å.

* * * * *